(12) United States Patent
Kim et al.

(10) Patent No.: US 9,311,986 B2
(45) Date of Patent: Apr. 12, 2016

(54) SEMICONDUCTOR MEMORY DEVICE

(71) Applicant: SK hynix Inc., Gyeonggi-do (KR)

(72) Inventors: Chang-Hyun Kim, Gyeonggi-do (KR);
Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/469,072

(22) Filed: Aug. 26, 2014

(65) Prior Publication Data
US 2015/0235694 A1 Aug. 20, 2015

(30) Foreign Application Priority Data

Feb. 19, 2014 (KR) .................. 10-2014-0019038

(51) Int. Cl.
*G11C 7/00* (2006.01)
*G11C 11/406* (2006.01)
*G11C 7/02* (2006.01)

(52) U.S. Cl.
CPC ............ *G11C 11/40626* (2013.01); *G11C 7/02* (2013.01); *G11C 11/40615* (2013.01)

(58) Field of Classification Search
CPC .......... G11C 11/406; G11C 11/40618; G11C 11/40611; G11C 7/04; G11C 11/565; G11C 29/02; G11C 29/80; G11C 11/40626; G11C 2207/104; G11C 11/40603; G11C 11/40622; G11C 11/4072; G11C 11/408
USPC ............... 365/222, 200, 189.07, 189.12, 193, 365/201, 212, 230.03
See application file for complete search history.

(56) References Cited

U.S. PATENT DOCUMENTS

2008/0205183 A1* 8/2008 Hwang ................ G11C 11/406
365/222

FOREIGN PATENT DOCUMENTS

KR 1020090045609 5/2009

* cited by examiner

*Primary Examiner* — Thong Q Le
(74) *Attorney, Agent, or Firm* — IP & T Group LLP

(57) ABSTRACT

A semiconductor memory device includes a control signal generator suitable for generating a control signal corresponding to temperature information, a refresh controller suitable for enabling a refresh signal for a smart refresh operation at a predetermined moment in response to a refresh command signal and enabling the refresh signal for a normal refresh operation at a moment corresponding to the control signal in response to the refresh command signal, and a data storage suitable for storing a data and performing the smart refresh operation and the normal refresh operation in response to the refresh signal of the refresh controller.

17 Claims, 7 Drawing Sheets

SEMICONDUCTOR MEMORY DEVICE

CROSS-REFERENCE TO RELATED APPLICATIONS

The present application claims priority of Korean Patent Application No. 10-2014-0019038, filed on Feb. 19, 2014, which is incorporated herein by reference in its entirety.

BACKGROUND

1. Field

Exemplary embodiments of the present invention relate to a semiconductor design technology and, more particularly, to a semiconductor memory device capable of performing a refresh operation.

2. Description of the Related Art

In general, a semiconductor memory device such as a Double Data Rate Synchronous Dynamic Random Access Memory (DDR SDRAM) includes multiple memory banks for storing data and each of the memory banks includes a large number of memory cells. The memory cells each have a cell capacitor and a cell transistor. The semiconductor memory device stores data by charging and discharging the cell capacitor. Ideally, the charge stored in the cell capacitor is to remain constant. However, in reality, the charge stored in the cell capacitor changes due to voltage differences in peripheral circuits. In other words, a charged cell capacitor may leak or, in reverse, a cell capacitor that should remain discharged may gain a charge. The cell capacitor charges represent data, which means that a change in the charge (or the voltage level) of a cell capacitor, if significant, may result in loss of data. In order to prevent data from being lost, semiconductor memory devices perform what are known as refresh operations. Since ordinary refresh operation methods are widely known to those skilled in the art, a detailed description thereon will be omitted.

As fabrication technologies have developed, so has the degree of integration in semiconductor devices. The increase in integration has resulted in a corresponding reduction in the size of semiconductor memory banks. The decrease in size of the memory banks has resulted in a decrease in the spacing between memory cells, which means a decrease in the space between word lines coupled with the memory cells. As the space between word lines decreases, there is increased concern about interference between word lines, an example being coupling effects.

In order to access a specific memory cell in the semiconductor memory device, an active operation of a word line coupled to the memory cell may be performed. However, as the space between word lines becomes increasingly narrow, the active operations of a word line may cause a voltage gain/drop in a neighboring word line. The voltage gain/drop in the neighboring word line may result in unintended charging or discharging of neighboring memory cells. As previously discussed, if significant, this may result in the loss of data.

In order to prevent memory cells from losing data, the semiconductor memory device may perform a refresh operation on all of the memory cells in a given memory bank. In other words, the refresh operations may be performed at a frequency high enough to ensure that data is not lost even in word lines that experience the greatest amount of interference. However, this operation method results in some memory cells being refreshed more than needed, unnecessary power consumption, and losses in operation efficiency. It would therefore be beneficial to intelligently control the refresh operations of each memory cell or group of memory cells depending on need.

Another consideration that needs to be taken into account, as the degree of integration in semiconductor devices increases, is the effect of temperature. As the circuit sizes become smaller, circuit temperature has a greater influence on circuit operations. Therefore, research is being carried out regarding control of circuit operations and how they are influenced by temperature.

SUMMARY

Exemplary embodiments of the present invention are directed to a semiconductor memory device that may control refresh operations based on the surrounding environment.

In accordance with an embodiment of the present invention, a semiconductor memory device includes a control signal generator suitable for generating a control signal corresponding to temperature information, a refresh controller suitable for enabling a refresh signal for a smart refresh operation at a predetermined moment in response to a refresh command signal and enabling the refresh signal for a normal refresh operation at a moment corresponding to the control signal in response to the refresh command signal, and a data storage suitable for storing a data and performing the smart refresh operation and the normal refresh operation in response to the refresh signal of the refresh controller.

Based on the inventive concept disclosed in this document, the number of times that normal refresh operations are performed may be controlled based on temperature information.

In accordance with another embodiment of the present invention, a semiconductor memory system includes a controller suitable for controlling a refresh operation by generating successive refresh command signals during a refresh operation section and replacing at least one refresh command signal among the successive refresh command signals with another command signal in response to temperature information, and a semiconductor memory device suitable for performing the refresh operation in response to the refresh command signal and performing an operation corresponding to the another command signal.

In another example, the semiconductor memory device may include a control signal generator suitable for generating a control signal corresponding to the temperature information, a refresh controller suitable for enabling a refresh signal for a smart refresh operation at a predetermined moment in response to the refresh command signal and enabling the refresh signal for a normal refresh operation at a moment corresponding to the control signal in response to the refresh command signal, and a data storage suitable for storing a data and performing the smart refresh operation and the normal refresh operation in response to the refresh signal of the refresh controller.

The semiconductor memory system may further include a circuit suitable for performing a corresponding operation in response to another command signal.

In accordance with another embodiment of the present invention, a method for operating the semiconductor memory system includes comparing a predetermined maximum number of times of a refresh operation during a refresh operation section with a number of times of a refresh operation to be performed, replacing the refresh operation with another operation based on a comparison result, and performing the refresh operation and the another operation.

The method for operating the semiconductor memory system may further include setting the number of times the refresh operation is to be performed based on temperature information.

The refresh operation may include a smart refresh operation which is performed at a predetermined moment.

The semiconductor memory device in accordance with the embodiment of the present invention secures a stable refresh operation by controlling the refresh operations based on the surrounding environment.

DETAILED DESCRIPTION

Figure 1:
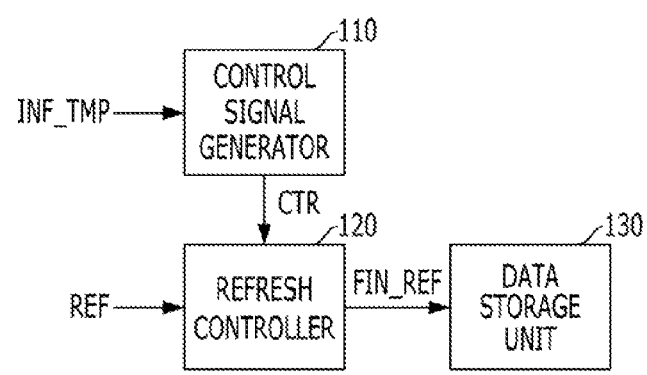
FIG. 1 is a block diagram illustrating a semiconductor memory device in accordance with an embodiment of the present invention.

Exemplary embodiments of the present invention will be described below in more detail with reference to the accompanying drawings. These embodiments are provided so that this disclosure will be thorough and complete, and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned.

FIG. 1 is a block diagram illustrating a semiconductor memory device in accordance with an embodiment of the present invention.

Referring to FIG. 1, the semiconductor memory device includes a control signal generator 110, a refresh controller 120 and a data storage unit 130.

The control signal generator 110 generates a control signal CTR in response to temperature information INF_TMP. The control signal CTR, which is to be described below, controls an enabling moment of a signal for a normal refresh operation.

The refresh controller 120 generates a final refresh signal FIN_REF in response to a refresh command signal REF. The final refresh signal FIN_REF is a signal which is enabled during the normal refresh operation and a smart refresh operation.

A refresh operation performed in the embodiment of the present invention is described hereafter. For example, the refresh operation may be divided into two types of operations. One is a normal refresh operation, which is performed based on a normal refresh command such as a self refresh command or an auto refresh command. The other is a smart refresh operation which is performed on a predetermined word line.

The smart refresh operation will be described in detail. Generally, a word line is enabled or disabled through an active operation. However, due to an increase in the integration degree, disturbance occurs in a neighboring word line which is disposed adjacent to an active word line where the active operation is performed. In short, a voltage level of the neighboring word line which is disposed adjacent to the active word line becomes unstable. Data stored in a memory cell which is coupled with the neighboring word line may be lost. Therefore, a refresh operation in accordance with the embodiment of the present invention may be performed on the neighboring word line, i.e., a predetermined word line, thereby preventing the memory cell coupled with the neighboring word line from losing the data.

Starting with a description of the refresh controller 120 the refresh controller 120 generates a final refresh signal FIN_REF in response to the refresh command signal REF. The final refresh signal FIN_REF is enabled for the normal refresh operation and the smart refresh operation. Particularly, the enabling moment for the normal refresh operation is controlled based on the control signal CTR, and its enabling moment for the smart refresh operation is controlled so that the final refresh signal FIN_REF is enabled at a predetermined moment. Hereafter, in the embodiment, it is described as an example that the number of times that the final refresh signal FIN_REF is enabled for the normal refresh operation is controlled based on the control signal CTR.

The data storage unit 130 stores a data and performs the normal refresh operation and the smart refresh operation in response to the final refresh signal FIN_REF.

The semiconductor memory device in accordance with the embodiment of the present invention may control a refresh operation based on temperature information INF_TMP. Particularly, the number of times that the normal refresh operation is performed is controlled based on the temperature information INF_TMP, while the smart refresh operation is performed at a predetermined moment regardless of the temperature information INF_TMP.

Figure 2:
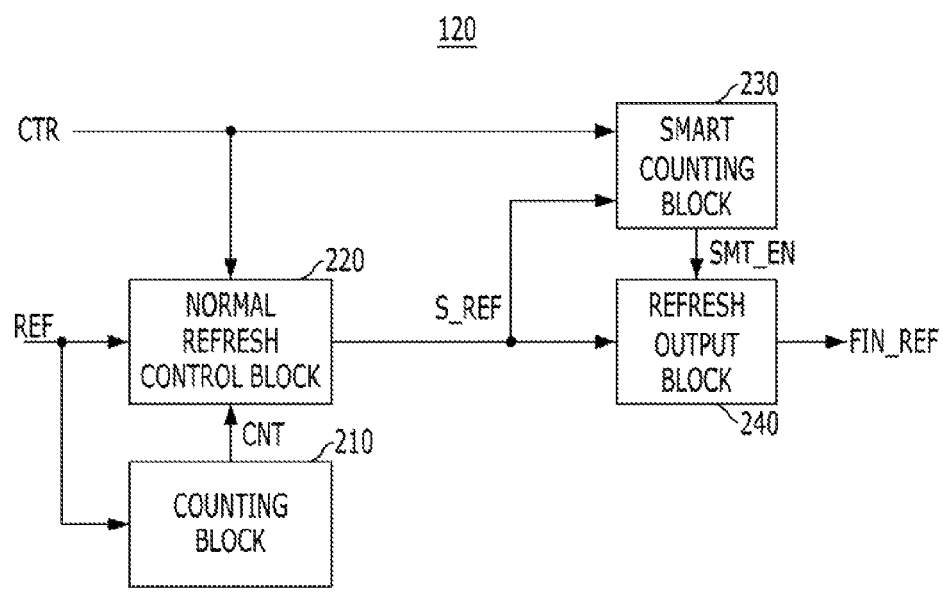
FIG. 2 is a block diagram illustrating a refresh controller 120 shown in FIG. 1.

FIG. 2 is a block diagram illustrating the refresh controller 120 shown in FIG. 1.

Referring to FIG. 2, the refresh controller 120 includes a counting block 210, a normal refresh control block 220, a smart counting block 230 and a refresh output block 240.

The counting block 210 generates a counting signal CNT by counting the refresh command signal REF. The normal refresh control block 220 generates a source refresh signal S_REF by reflecting the control signal CTR and the counting signal CNT into the refresh command signal REF. As described above, the control signal CTR is a signal corresponding to the temperature information INF_TMP. The normal refresh control block 220 may output the refresh command signal REF as the source refresh signal S_REF at a moment defined by the control signal CTR and the counting signal CNT and control the number of times that the source refresh signal S_REF is enabled based on the control signal CTR. The relationship between the control signal CTR and the source refresh signal S_REF is described in detail with reference to FIG. 3.

The smart counting block 230 generates a smart refresh enabling signal SMT_EN by counting the number of times that the source refresh signal S_REF toggles. The maximum value of the counted number by the smart counting block 230 is controlled based on the control signal CTR, and the smart refresh enabling signal SMT_EN is enabled when the number of times that the source refresh signal S_REF toggles is equal to the maximum value. The refresh output block 240 outputs the final refresh signal FIN_REF in response to the source refresh signal S_REF. The source refresh signal S_REF is a signal for the normal refresh operation, and the smart refresh enabling signal SMT_EN is a signal for the smart refresh operations The source refresh signal S_REF and the smart refresh enabling signal SMT_EN is to be described again below.

The semiconductor memory device in accordance with an embodiment of the present invention may control an enabling moment of the final refresh signal FIN_REF based on a control signal CTR that is based on the temperature information INF_TMP.

Figure 3:
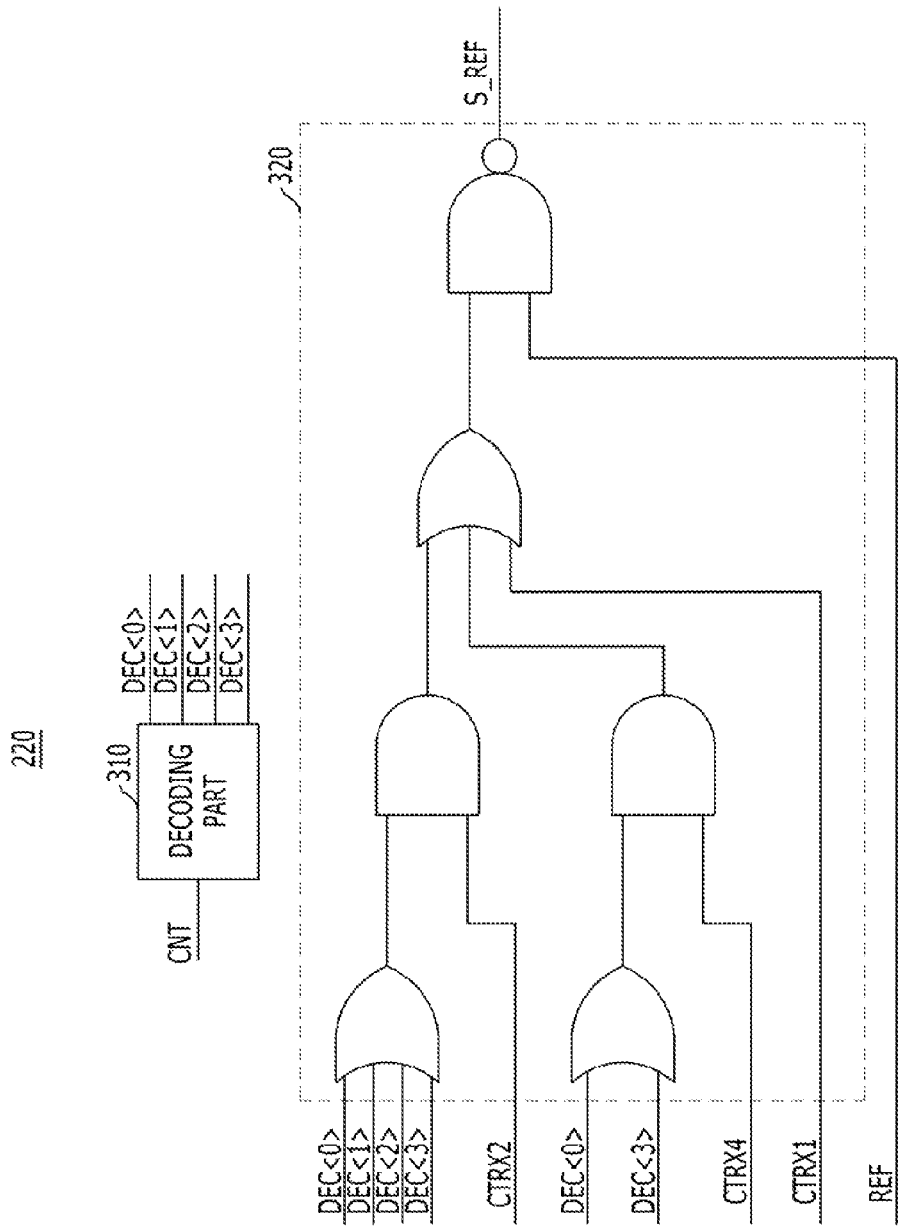
FIG. 3 is a diagram illustrating a normal refresh control block 220 shown in FIG. 2.

FIG. 3 is a diagram illustrating the normal refresh control block 220 shown in FIG. 2.

Referring to FIG. 3, the normal refresh control block 220 includes a decoding part 310 and a selection and transmission part 320.

The decoding part 310 generates decoding signals DEC<0:3> by decoding the counting signal CNT. As an example, the decoding signals DEC<0:3> have a four-bit code. The selection and transmission part 320 selectively outputs the refresh command signal REF as the source refresh signal S_REF in response to the control signal CTR (refer to FIGS. 2 and 3) and the decoding signals DEC<0:3>. In FIG. 3, the control signal CTR is divided into a first control signal CTRx1, a second control signal CTRx2 and a third control signal CTRx4 which may be based on the temperature information INF_TMP.

Hereafter, a simple circuit operation is described. As an example, the counting signal CNT is counted from 0 to 3, and the decoding signals DEC<0:3> are sequentially enabled in response to the counting signal CNT.

When the first control signal CTRx1 is enabled, the refresh command signal REF is outputted as the source refresh signal S_REF regardless of the counting signal CNT, i.e., the decoding signals DEC<0:3>. When the second control signal CTRx2 is enabled, the refresh command signal REF is outputted as the source refresh signal S_REF when the counting signal CNT becomes 0, 2 and 3. In other words, the decoding signal DEC<0>, the decoding signal DEC<2>, and the decoding signal DEC<3> are enabled. When the third control signal CTRx4 is enabled, the refresh command signal REF is outputted as the source refresh signal S_REF in a situation where the counting signal CNT becomes 0 and 3. A detailed description thereon is described below with reference to FIGS. 5 to 7.

The normal refresh control block 220 in accordance with an embodiment of the present invention may selectively output the refresh command signal REF as the source refresh signal S_REF at a predetermined moment by combining the control signals CTRx1, CTRx2, and CTRx4 corresponding to the temperature information INF_TMP and the counting signal CIT.

Figure 4:
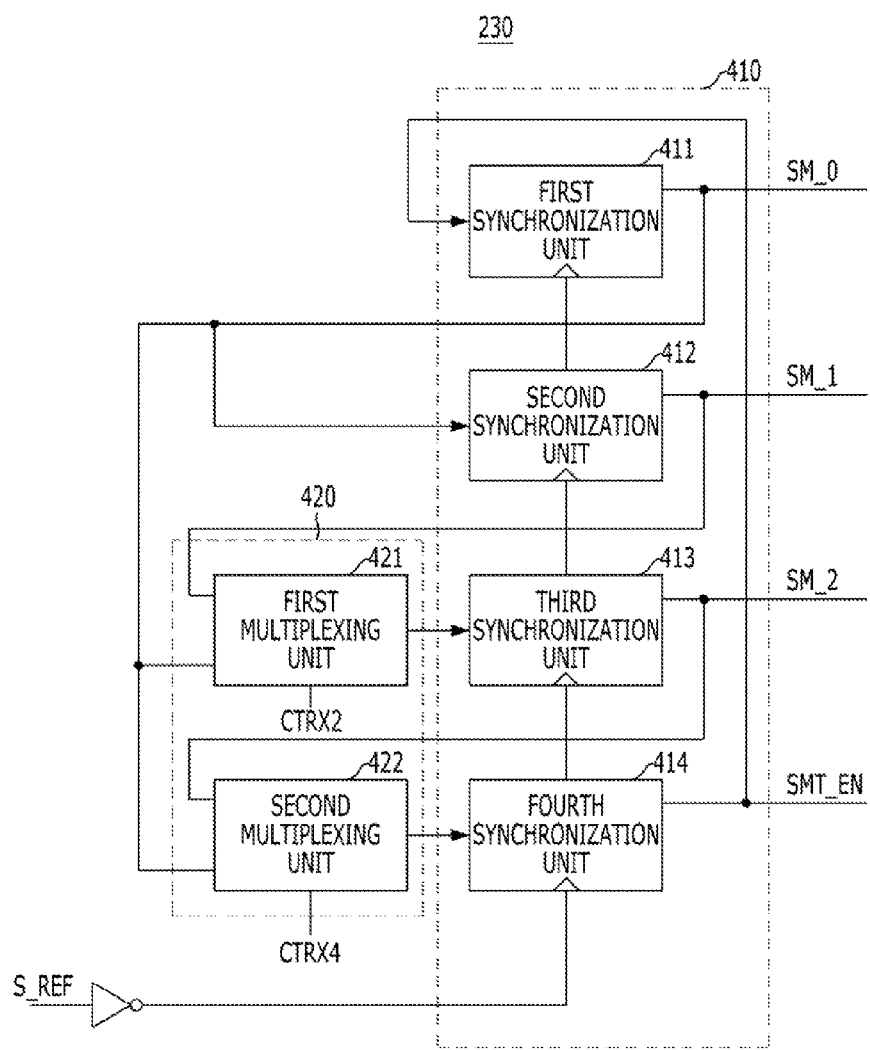
FIG. 4 is a diagram illustrating a smart counting block 230 shown in FIG. 2.

FIG. 4 is a diagram illustrating the smart counting block 230 shown in FIG. 2.

Referring to FIG. 4, the smart counting block 230 includes a shifting part 410 and a path control part 420.

The shifting part 410 is for performing a shifting operation in response to the source refresh signal S_REF and includes first to fourth synchronization units 411, 412, 413 and 414. Each of the first to fourth synchronization units 411, 412, 413 and 414 outputs an input signal in response to the source refresh signal S_REF.

The path control part 420 controls a signal transmission path of the shifting part 410 in response to the second control signal CTRx2 and the third control signal CTRx4 and includes first and second multiplexing units 421 and 422. The first multiplexing unit 421 outputs an output signal SM_0 of the first synchronization unit 411 or an output signal SM_1 of the second synchronization unit 412 to the third synchronization unit 413 in response to the second control signal CTRx2. The second multiplexing unit 422 outputs the output signal SM_0 of the first synchronization unit 411 or an output signal SM_2 of the third synchronization unit 413 to the fourth synchronization unit 414 in response to the third control signal CTRx4.

Hereafter, a simple circuit operation is described. As an example, the maximum counting value set by the smart counting block 230 is 4.

When the first control signal CTRx1 (refer to FIG. 3) is enabled, the smart refresh enabling signal SMT_EN inputted to the first synchronization unit 411 is outputted in response to the source refresh signal S_REF, and outputted through the second synchronization unit 412, the third synchronization unit 413 and the fourth synchronization unit 414. As a result, the smart refresh enabling signal SMT_EN is enabled again after four shifting operations are performed.

When the second control signal CTRx2 is enabled, the smart refresh enabling signal SMT_EN inputted to the first synchronization unit 411 is outputted in response to the source refresh signal S_REF, and outputted to the third synchronization unit 413 through the first multiplexing unit 421. And then, the smart refresh enabling signal SMT_EN is outputted through the third synchronization unit 413 and the fourth synchronization unit 414. As a result, the smart refresh enabling signal SMT_EN is enabled again after three shifting operations are performed.

When the third control signal CTRx4 is enabled, the smart refresh enabling signal SMT_EN is outputted through the first synchronization unit 411, the second multiplexing unit 422 and the fourth synchronization unit 414.

The smart counting block 230 in accordance with the embodiment of the present invention may control a counting operation of the source refresh signal S_REF in response to the first control signal CTRx1, the second control signal CTRx2 and the third control signal CTRx4 corresponding to the temperature information INF_TMP.

Figure 5:
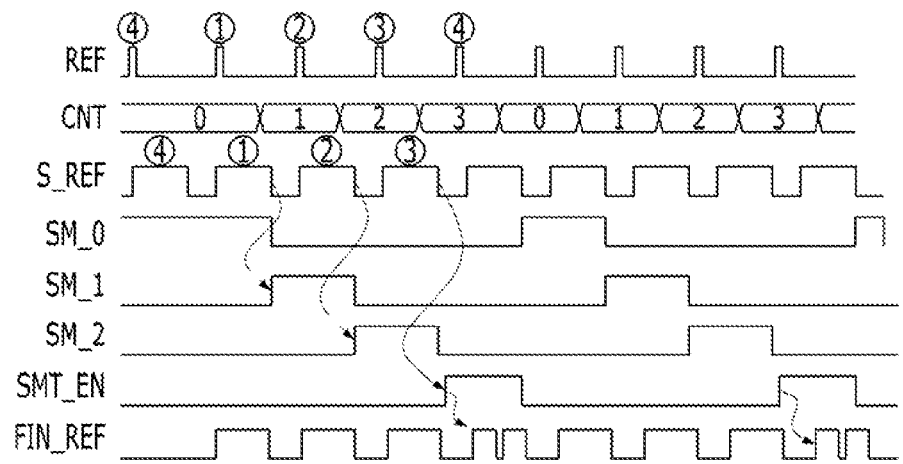
FIGS. 5 to 7 are timing diagrams illustrating circuit operations shown in FIGS. 1 to 4.
Figure 6:
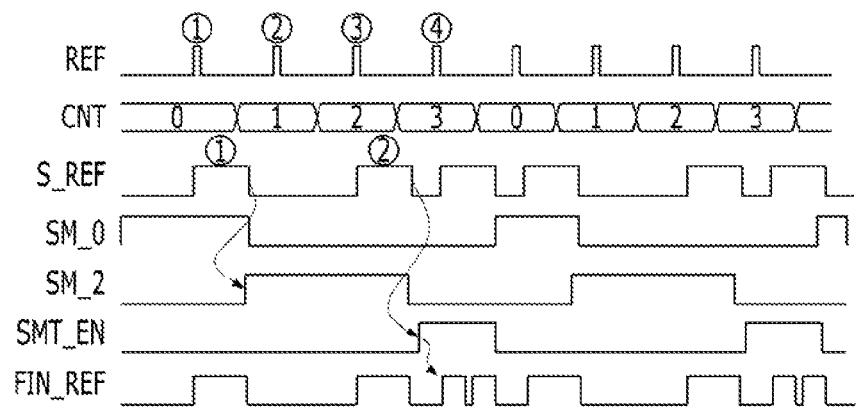
Figure 7:
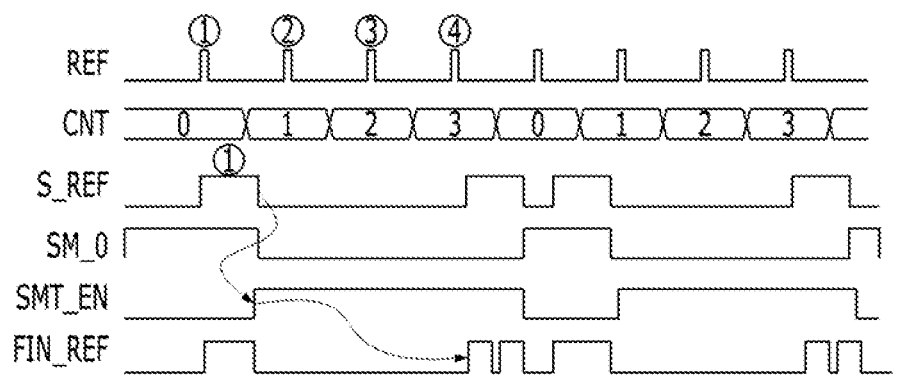

FIGS. 5 to 7 are timing diagrams illustrating circuit operations shown in FIGS. 1 to 4. As an example, a smart refresh operation is performed in response to the refresh command signal REF which is enabled a fourth time. The source refresh signal S_REF shown in FIGS. 5 to 7 has a controlled pulse width so that the shifting part 410 shown in FIG. 4 may perform a shifting operation at a falling edge of the source refresh signal S_REF.

FIG. 5 illustrates that the first control signal CTRx1 is enabled.

Referring to FIGS. 1 to 5, the normal refresh control block 220 outputs the refresh command signal REF as the source refresh signal S_REF. The smart counting block 230 shown in FIG. 4 enables the smart refresh enabling signal SMT_EN after counting the source refresh signal S_REF four times. As described above, the shifting part 410 shown in FIG. 4 performs the shifting operation at the falling edge of the source refresh signal S_REF. The refresh output block 240 shown in FIG. 2 generates the final refresh signal FIN_REF for controlling the normal refresh operation and the smart refresh operation in response to the source refresh signal S_REF and the smart refresh enabling signal SMT_EN. A section where the final refresh signal FIN_REF is enabled two times when the refresh command signal REF is enabled once is defined as a smart refresh operation section.

Consequently, when the first control signal CTRx1 is enabled, the semiconductor memory device performs three normal refresh operations in response to the pulses ①, ② and ③ of the refresh command signal REF, and performs one smart refresh operation in response to the pulse ④ of the refresh command signal REF.

FIG. 6 illustrates that the second control signal CTRx2 is enabled.

Referring to FIG. 6, when the counting signal CNT becomes 0, 2 and 3, the refresh command signal REF is outputted as the source refresh signal S_REF, and the smart refresh enabling signal SMT_EN is enabled in response to the pulse ② of the source refresh signal S_REF. The final refresh signal FIN_REF is generated in response to the source refresh signal S_REF and the smart refresh enabling signal SMT_EN. Consequently, when the second control signal CTRx2 is enabled, the semiconductor memory device performs two normal refresh operations in response to the pulses ①, ② and ③ of the refresh command signal REF, and performs one smart refresh operation in response to the pulse ④ of the refresh command signal REF.

FIG. 7 illustrates that the third control signal CTRx4 is enabled.

Referring to FIG. 7, when the counting signal CNT becomes 0 and 3, the refresh command signal REF is outputted as the source refresh signal S_REF, and the smart refresh enabling signal SMT_EN is enabled in response to the pulse ① of the source refresh signal S_REF. Consequently, when the third control signal CTRx4 is enabled, the semiconductor memory device performs one normal refresh operation in response to the pulses ①, ② and ③ of the refresh command signal REF, and performs one smart refresh operation in response to the pulse ④ of the refresh command signal REF.

As shown in FIGS. 5 to 7, the semiconductor memory device in accordance with the embodiment of the present invention may control a moment where the normal refresh operation is performed based on the first control signal CTRx1, the second control signal CTRx2 and the third control signal CTRx4 corresponding to the temperature information INF_TMP. Also, the semiconductor memory device may perform the smart refresh operation at a predetermined moment in response to the refresh command signal REF.

Figure 8:
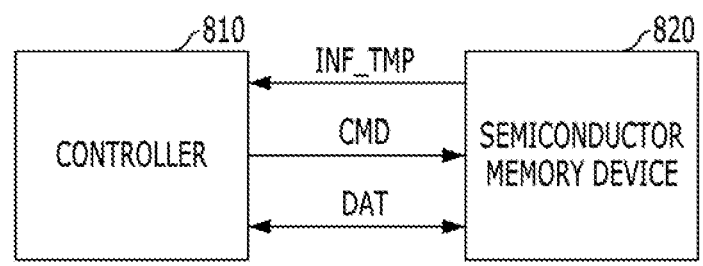
FIG. 8 is a block diagram illustrating a semiconductor memory system in accordance with another embodiment of the present invention.

FIG. 8 is a block diagram illustrating a semiconductor memory system in accordance with another embodiment of the present invention.

Referring to FIG. 8, the semiconductor memory system includes a controller 810 and a semiconductor memory device 820.

The controller 810 controls the semiconductor memory device 820 by a command signal CMD, and the semiconductor memory device 820 performs various operations based on the command signal CMD. The semiconductor memory device 820 may perform an operation for storing a data DAT, an operation for outputting the data DAT, a refresh operation, and so on in response to the command signal CMD. Hereafter, the command signal CMD corresponding to the refresh operation is defined as a refresh command signal.

The controller 810 may control the number of times that the refresh operation is performed based on temperature information INF_TMP which is supplied from the semiconductor memory device 820. In other words, the controller 810 may control the number of times that the refresh operation is performed during a predetermined refresh operation section. Also, the controller 810 may input a command signal other than the refresh command signal during the refresh operation section when the refresh command signal is enabled less than the maximum number of times that the refresh command signal may be enabled during the refresh operation section, which is referred to as 'the maximum refresh operation number of times', hereafter). In other words, the controller 810 may replace the refresh command signal with another command signal during the refresh operation section.

Figure 9:
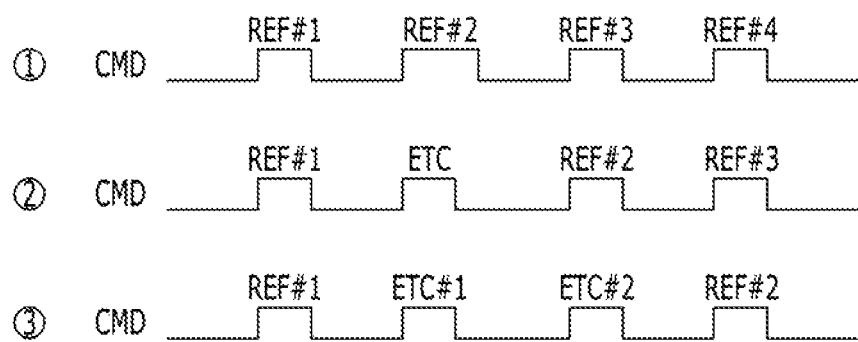
FIG. 9 is a timing diagram illustrating a simple circuit operation of the semiconductor memory system shown in FIG. 8.

FIG. 9 is a timing diagram illustrating a simple circuit operation of the semiconductor memory system shown in FIG. 8. As an example, the refresh command signal REF is enabled a maximum of four times during the refresh operation section.

Referring to FIG. 9, example ① shows that the refresh command signal is enabled four times (REF#1, REF#2, REF#3 and REF#4) which is the maximum enabling number of times. Example ② shows that the refresh command signal is enabled three times (REF#1, REF#2 and REF#3), and another command signal is replaced and enabled (ETC) one time, while example ③ shows that the refresh command signal is enabled two times (REF#1 and REF#2), and other command signals are replaced and enabled two times (ETC#1 and ETC#2).

Referring back to FIG. 8, the semiconductor memory device 820 performs the refresh operation in response to the refresh command signal REF shown in FIG. 9, and performs a corresponding operation in response to the another command signal ETC.

The semiconductor memory system in accordance with the embodiment of the present invention may control a refresh operation moment based on the temperature information INF_TMP, and control the semiconductor memory device 820 to perform another operation during the refresh operation section by enabling another command signal during the refresh operation section.

Referring back to FIG. 8, the refresh command signal inputted to the semiconductor memory device 820 is a signal where the temperature information INF_TMP is reflected. The refresh command signal inputted to the semiconductor memory device 820 has similar information to the source refresh signal S_REF shown in FIG. 2. In other words, the two signals have information on an enabling moment of a signal for the normal refresh operation. Therefore, the semiconductor memory device 820 may include the smart counting block 230 and the refresh output block 240, which are shown in FIG. 2, to perform the smart refresh operation.

Figure 10:
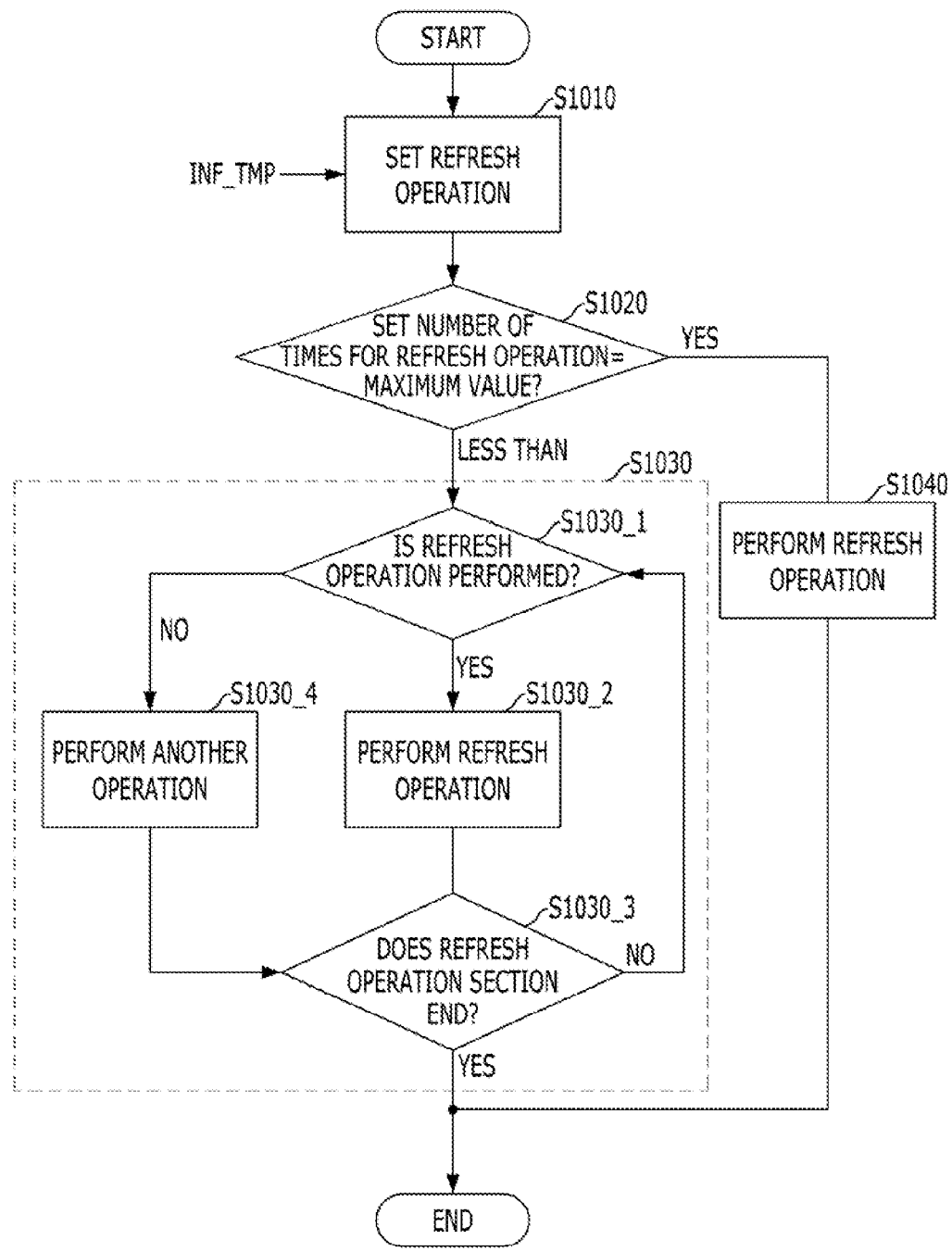
FIG. 10 is a flow-chart describing a method for operating the semiconductor memory system shown in FIG. 9.

FIG. 10 is a flow-chart describing a method for operating the semiconductor memory system shown in FIG. 9.

Referring to FIG. 10, the method for operating the semiconductor memory system includes setting a refresh operation in step S1010, comparing the number of times that the refresh operation is performed in step S1020, replacing the operation in step S1030 and performing the refresh operation in step S1040.

The refresh operation is set in step S1010. In other words, the number of times that the refresh operation is performed is set in response to temperature information INF_TMP in step S1010. In the step S1010, as shown in example ② of FIG. 9, a refresh command signal may be set to be enabled three times during a refresh operation section. Hereafter, the number of times that the refresh operation is performed which is set as above is referred to as 'the set number of times for the refresh operation'.

The number of times that the refresh operation is performed is compared in step S1020. In other words, the set number of times of step S1010 is compared with the maximum number of times for the refresh operation in step S1020. When the set number of times is smaller than the maximum number of times ('LESS THAN'), step S1030 is carried out, and when the set number of times is the same as the maximum number of times ('YES'), step S1040 is carried out. When the set number of times is the same as the maximum number of times is the same as example ① of FIG. 9, and four refresh command signals are generated in step S1040.

An omitted refresh operation is replaced with another operation based on the temperature information INF_TMP in step S1030. Step S1030 includes determining whether the refresh operation is performed in step S1030_1, performing the refresh operation in step S1030_2, determining a refresh operation section in step S1030_3, and performing another operation in step S1030_4.

Whether the refresh operation is performed is determined in step S1030_1. When the refresh operation is performed ('YES'), step S1030_2 is carried out, and when the refresh operation is skipped ('NO'), step S1030_4 is carried out. Herein, the refresh operation is performed in the step S1030_2. Whether the refresh operation section ends is determined in step S1030_3. In step S1030_3, when the refresh operation section ends ('YES'), the refresh operation ends, and when the refresh operation section does not end ('NO'), step S1030_1 is carried out, and whether the refresh operation is performed is determined again. Meanwhile, an operation other than the refresh operation is performed in step S1030_4.

When the set number of times for the refresh operation is three, and the maximum number of times for the refresh operation is four in example ② of FIG. 9, another command signal ETC may be generated based on the temperature information INF_TMP at the moment when the omitted refresh operation is replaced.

The method of operating the semiconductor memory system in accordance with the embodiment of the present invention may include controlling the number of times that the refresh operation is performed based on the temperature information INF_TMP and performing or passing the refresh operation. Also, the method may include performing another operation in lieu of the refresh operation which is passed.

As described above, in accordance with the embodiments of the present invention, a moment when a normal refresh operation is performed may be controlled based on temperature information INF_TMP, and a smart refresh operation may be controlled to be performed at a predetermined moment.

In accordance with the embodiments of the present invention, as a refresh operation is secured even though the surrounding environment changes, the reliability of stored data may increase.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor memory device, comprising:
   a control signal generator suitable for generating a control signal corresponding to temperature information;
   a refresh controller suitable for enabling a refresh signal for a smart refresh operation at a predetermined moment in response to a refresh command signal and enabling the refresh signal for a normal refresh operation at a moment corresponding to the control signal in response to the refresh command signal; and
   a data storage suitable for storing a data and performing the smart refresh operation and the normal refresh operation in response to the refresh signal of the refresh controller.

2. The semiconductor memory device of claim 1, wherein the number of times that the normal refresh operation is performed is controlled based on the temperature information.

3. The semiconductor memory device of claim 1, wherein the refresh controller includes:
   a counting block suitable for generating a counting signal by counting the refresh command signal;
   a normal refresh control block suitable for generating a source refresh signal by reflecting the counting signal and the control signal into the refresh command signal;
   a smart counting block suitable for generating a smart refresh enabling signal by controlling a maximum counting value based on the control signal and counting the source refresh signal by the maximum counting value; and
   a refresh output block suitable for outputting the refresh signal corresponding to the smart refresh operation and the normal refresh operation in response to the source refresh signal and the smart refresh enabling signal.

4. The semiconductor memory device of claim 3, wherein the normal refresh control block includes:
   a decoding part suitable for decoding the counting signal; and
   a selection and transmission part suitable for selectively outputting the refresh command signal as the source refresh signal in response to the control signal and an output signal of the decoding part.

5. The semiconductor memory device of claim 3, wherein the smart counting block includes:
   a shifting part suitable for performing a shifting operation on the smart refresh enabling signal in response to the source refresh signal; and
   a path control part suitable for controlling a signal transmission path of the shifting part in response to the control signal.

6. The semiconductor memory device of claim 3, wherein the normal refresh control block controls the number of times that the source refresh signal is enabled in response to the control signal.

7. The semiconductor memory device of claim 5, wherein the path control part controls the number of times that the shifting operation is performed in response to the control signal.

8. A semiconductor memory system, comprising:
   a controller suitable for controlling a refresh operation by generating successive refresh command signals during a refresh operation section and replacing at least one refresh command signal among the successive refresh command signals with another command signal in response to temperature information; and
   a semiconductor memory device suitable for performing the refresh operation in response to the refresh command signal and performing an operation corresponding to the another command signal.

9. The semiconductor memory system of claim 8, wherein the semiconductor memory device includes:
   a control signal generator suitable for generating a control signal corresponding to the temperature information;
   a refresh controller suitable for enabling a refresh signal for a smart refresh operation at a predetermined moment in response to the refresh command signal and enabling the refresh signal for a normal refresh operation at a moment corresponding to the control signal in response to the refresh command signal; and a data storage suitable for storing a data and performing the smart refresh operation and the normal refresh operation in response to the refresh signal of the refresh controller.

10. The semiconductor memory system of claim 9, wherein the refresh controller includes:

a smart counting block suitable for generating a smart refresh enabling signal by controlling a maximum counting value based on the control signal and counting the refresh command signal by the maximum counting value; and a refresh output block suitable for outputting the refresh signal corresponding to the smart refresh operation and the normal refresh operation in response to the source refresh signal and the smart refresh enabling signal.

11. The semiconductor memory system of claim 8, further comprising:

a circuit suitable for performing a corresponding operation in response to the another command signal.

12. The semiconductor memory system of claim 8, wherein the number of times that the refresh operation is performed is controlled based on the temperature information.

13. The semiconductor memory system of claim 8, wherein the refresh command signal is a signal corresponding to the normal refresh operation.

14. A method for operating a semiconductor memory system, comprising:

comparing a predetermined maximum number of times of a refresh operation during a refresh operation section with a number of times of a refresh operation to be performed;

replacing the refresh operation with another operation based on a comparison result; and performing the refresh operation and the another operation.

15. The method of claim 14, further comprising:

setting the number of times of the refresh operation is to be performed based on temperature information.

16. The method of claim 14, wherein the replacing of the refresh operation with another operation based on the comparison result includes:

performing the refresh operation and the another operation by determining whether the refresh operation is performed; and determining whether the refresh operation section ended.

17. The method of claim 14, wherein the refresh operation includes a smart refresh operation which is performed at a predetermined moment.

* * * * *